US 10,771,058 B2

(12) United States Patent
Roberts et al.

(10) Patent No.: US 10,771,058 B2
(45) Date of Patent: Sep. 8, 2020

(54) AIRCRAFT HIGH CURRENT SWITCH MODULE

(71) Applicant: GE Aviation Systems Limited, Cheltenham Gloucestershire (GB)

(72) Inventors: David Killin Roberts, Pershore (GB); Keval Mehta, Cheltenham (GB); Julian Peter Mayes, Cheltenham (GB)

(73) Assignee: GE Aviation Systems Limited, Cheltenham Gloucestershire (GB)

( * ) Notice: Subject to any disclaimer, the term of this patent is extended or adjusted under 35 U.S.C. 154(b) by 26 days.

(21) Appl. No.: 15/862,237

(22) Filed: Jan. 4, 2018

(65) Prior Publication Data

US 2018/0198445 A1    Jul. 12, 2018

(30) Foreign Application Priority Data

Jan. 6, 2017    (GB) ..................... 1700227

(51) Int. Cl.
| | |
|---|---|
| H01P 1/15 | (2006.01) |
| B60L 1/00 | (2006.01) |
| H03K 17/693 | (2006.01) |
| B60R 16/03 | (2006.01) |
| H02J 3/14 | (2006.01) |
| H02J 4/00 | (2006.01) |
| F02C 7/32 | (2006.01) |
| F01D 15/10 | (2006.01) |
| B60L 15/12 | (2006.01) |

(52) U.S. Cl.
CPC ....... *H03K 17/693* (2013.01); *B60R 16/0315* (2013.01); *F01D 15/10* (2013.01); *F02C 7/32* (2013.01); *H01P 1/15* (2013.01); *H02J 3/14* (2013.01); *H02J 4/00* (2013.01); *B64D 2221/00* (2013.01)

(58) Field of Classification Search
CPC ............... H01P 1/15; B60L 1/00; B60L 15/12
USPC ......................................... 333/101
See application file for complete search history.

(56) References Cited

U.S. PATENT DOCUMENTS

| | | | |
|---|---|---|---|
| 4,811,163 A | | 3/1989 | Fletcher |
| 5,451,533 A | * | 9/1995 | Williams ............ H01L 29/1087 |
| | | | 148/DIG. 126 |

(Continued)

FOREIGN PATENT DOCUMENTS

| | | |
|---|---|---|
| EP | 1 220 417 A2 | 7/2002 |
| EP | 1220417 B1 | 8/2011 |

(Continued)

OTHER PUBLICATIONS

Combined Search and Examination Report issued in connection with corresponding GB Application No. 1700227.0 dated Jun. 28, 2017.

(Continued)

*Primary Examiner* — Dean O Takaoka
(74) *Attorney, Agent, or Firm* — McGarry Bair PC

(57) ABSTRACT

A switch module includes a first single-throw switch having a first input terminal 20 switchable to a common terminal. A second single-throw switch has a second input terminal switchable to the common terminal. A first control is coupled to the first single-throw switch and a second control is coupled to the second single-throw switch. The first and second controls are configured to independently control, respectively, the first and second single-throw switches.

19 Claims, 6 Drawing Sheets

(56) References Cited

U.S. PATENT DOCUMENTS

| | | |
|---|---|---|
| 5,808,378 A | 9/1998 | O'Leary |
| 7,034,345 B2* | 4/2006 | Chang .................... H01L 24/49 |
| | | 257/131 |
| 7,868,621 B2* | 1/2011 | Liu ...................... G01R 31/008 |
| | | 324/512 |
| 7,950,606 B2* | 5/2011 | Atkey .................... B64D 13/06 |
| | | 244/135 R |
| 8,836,338 B2* | 9/2014 | Tyler ................ G01R 31/3277 |
| | | 324/418 |
| 9,081,568 B1* | 7/2015 | Ross ...................... G06F 1/3203 |
| 9,302,636 B2* | 4/2016 | Schult .................... B60R 16/03 |
| 9,337,660 B1 | 5/2016 | Bourstein |
| 9,963,095 B2* | 5/2018 | Huang .................... F01D 15/10 |
| 2010/0181826 A1 | 7/2010 | Fuller et al. |
| 2013/0154357 A1 | 6/2013 | Schult et al. |
| 2013/0169036 A1* | 7/2013 | Todd ........................ H02J 4/00 |
| | | 307/9.1 |
| 2014/0132062 A1* | 5/2014 | Brombach ................ B64F 1/34 |
| | | 307/9.1 |
| 2016/0308372 A1 | 10/2016 | Kolla et al. |

FOREIGN PATENT DOCUMENTS

| | | |
|---|---|---|
| EP | 3 101 750 A1 | 12/2016 |
| EP | 3101750 A1 | 12/2016 |
| JP | 3-148866 A * | 6/1991 |

OTHER PUBLICATIONS

Intellectual Property Office, Examination Report under Section 18(3) re Application No. GB1700227.0, dated Oct. 17, 2019, 3 pages, South Wales, NP.

Intellectual Property Office, Examination Report under Section 18(3) re Corresponding Application No. GB1700227.0, dated Jun. 30, 2020, South Wales, NP.

* cited by examiner

AIRCRAFT HIGH CURRENT SWITCH MODULE

BACKGROUND

High current electrical networks, such as the primary system in an aircraft electrical system, can utilize an individual single-throw switch for each switchable branch connecting an element in the network. The single-throw switch can conduct tens or hundreds of amperes from one or more sources of electrical power to various essential and non-essential loads in the network. Each switch can often be connectorized and/or rack mounted.

Unfortunately, each switch can require a custom design in a network having many individual switches, thereby increasing cost and complexity. Additionally, each switch can require at least two high-current connector terminals for connecting the switched element, each connector terminal posing a risk to a reliability of the network should the terminal fail. The individual switch can also include a custom housing that retains the connector terminals, protects the switch, and/or occupies a finite volume in the aircraft electrical system.

SUMMARY

In one aspect, there is disclosed a switch module which can comprise a first single-throw switch having a first input terminal switchable to a common terminal. A second single-throw switch can have a second input terminal switchable to the common terminal. A first control can be coupled to the first single-throw switch and a second control can be coupled to the second single-throw switch. The first and second controls can be configured to independently control, respectively, the first and second single-throw switches.

In another aspect, there is disclosed a method of interconnecting a plurality of elements in a network having at least two switchable branches. The method can comprise identifying a network node where a first switchable branch connecting a first element meets a second switchable branch connecting a second element. The method can further include configuring a switch module with a first single-throw switch having a first input terminal and a second single-throw switch having a second input terminal. The first and the second single-throw switches can be connected in series at a common terminal. The method can further include locating the common terminal of the switch module at the network node, connecting the first input terminal to the first element, and connecting the second input terminal to the second element.

In yet another aspect, there is disclosed an aircraft which can comprise a network having at least two switchable branches. The aircraft can include a network node where a first switchable branch connecting a first element meets a second switchable branch connecting a second element. A switch module can have a first single-throw switch with a first input terminal connected to the first element and can have a second single-throw switch with a second input terminal connected to the second element. The first and the second single-throw switches can be connected in series at a common terminal. A first control can be coupled to the first single-throw switch and a second control can be coupled to the second single-throw switch. The first and second controls can be configured to independently control, respectively, the first and second single-throw switches.

DETAILED DESCRIPTION

Figure 1:
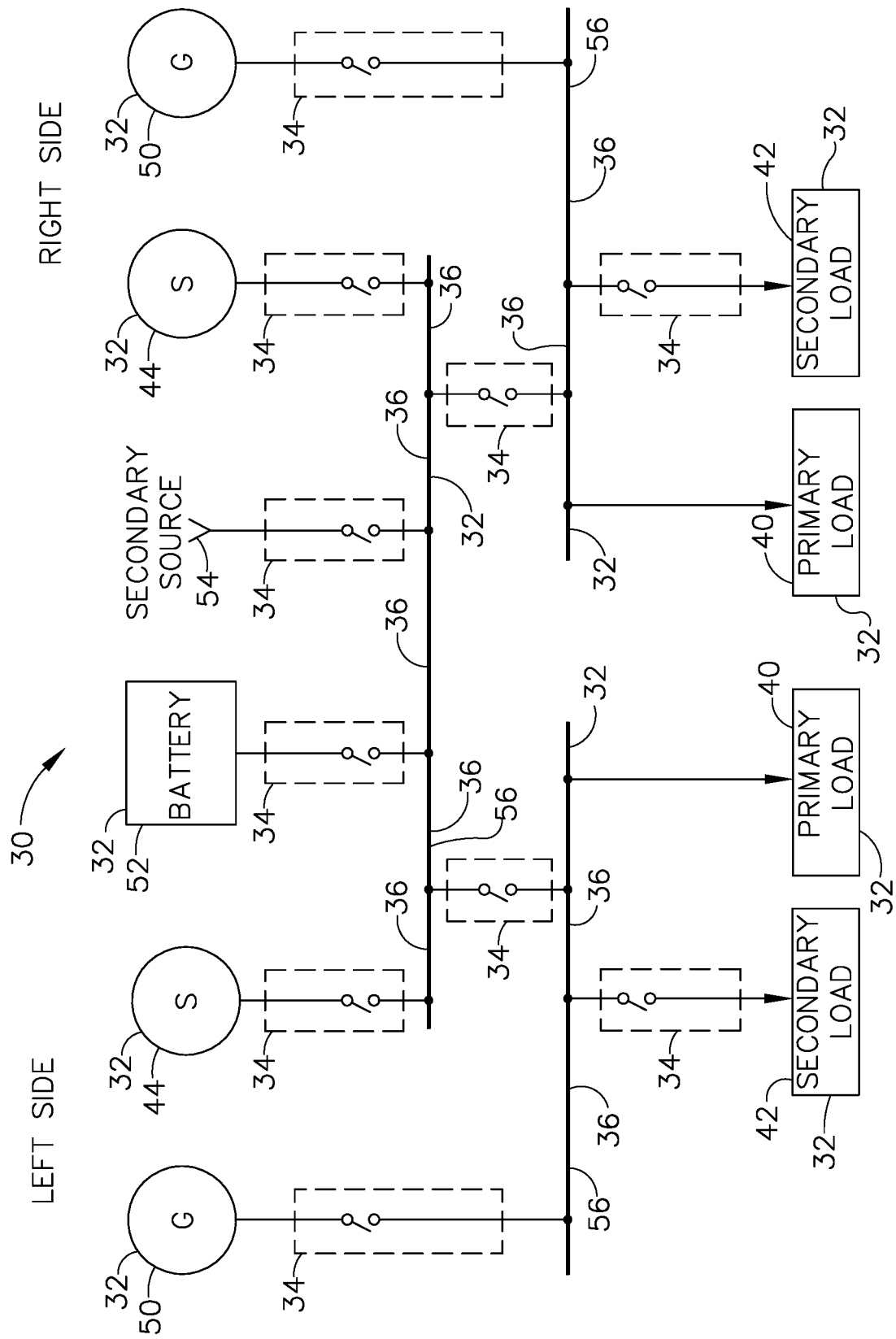
FIG. 1 illustrates a first electrical network of elements connected with switchable branches.

FIG. 1 illustrates an electrical network 30 comprising a plurality of elements 32 connectable by at least two switchable branches 34. The at least two switchable branches 34 can each selectively connect at least one of the plurality of elements 32 to one of a plurality of network nodes 36. Each of the network nodes 36 can be defined as the place where two or more switchable branches 34 electrically meet. For example, FIG. 1 illustrates ten switchable branches 34 connecting the plurality of elements 32 through network nodes 36. Each element 32 can be a source of electrical power such as a left or right generator 50, a battery 52, or a secondary source 54. Each element 32 can also be a load such as a left or right primary load 40, a left or right secondary load 42, or a left or right starter 44. Each of the switchable branches 34 can be implemented as an individual single-pole or multi-pole switch, depending on the number of conductors being switched through the switchable branch.

A bus bar 56 can function as one of the network nodes 36 and can comprise a low resistance conductor for receiving power from at least one source of electrical power in the network 30, such as one of the generators 50, and delivering the received power to at least two other elements 32 in the network, such as one of the primary loads 40 and one of the secondary loads 42. The resistance of each bus bar 56 can be considered to be approximately zero ohms compared to a resistance of a load, such as one of the secondary loads 42, since the electrical meeting point between two switchable branches 34 meeting at the bus bar 56 is essentially the same anywhere along the bus bar 56 and thus forms one network node 36. The bus bar 56 can also be considered to be an element 32, and a switchable branch 34 can switch the bus bar 56 to another network node 36 or to another bus bar.

Continuing with FIG. 1, the electrical network 30 can be, but is not limited to, a primary system of a high current aircraft electrical system. For example, the primary system can be a 28V direct current (DC) primary electrical system for a small to medium twin-engine aircraft. The primary system can also be an alternating current (AC) primary electrical for a commercial or military aircraft, such as a three-phase AC system. Loads within the primary system of the aircraft can include essential and non-essential loads. Each switchable branch 34 can be of custom design to accommodate a high current flow that is unique from other switchable branches in the electrical network 30. The electrical network 30 can also apply to ground transportation, rail, or marine applications where high current electrical power distribution is required.

Each of the switchable branches 34 can be individually packaged and connectorized. The electrical network 30 can be configured via switchable branches 34 for a variety of operating modes, such as energizing one of the starters 44 or bridging a left bus bar 56 to a right bus bar 56. The primary loads 40 can be considered essential loads and can be energized directly by one of the bus bars 56. For example, in an aircraft, the primary loads 40 can each be, but are not limited to, a galley load, an electro-thermal airframe de-icing systems, or a transformer rectifier unit (TRU). The secondary loads 42 can be considered non-essential loads and can be energized through one of the switchable branches 34. Examples of secondary loads 42 can be, but are not limited to, avionics equipment, exterior lighting, and cabin lighting.

The secondary source 54 can be a ground power supply supplying power to electrical network 30 from a terrestrial power supply (not shown). For example, secondary source 54 can be a terrestrial power supply positioned at an airport terminal adjacent to an aircraft parked for loading and unloading the aircraft. In alternate applications, the secondary source 54 can be a battery or a power supply positioned at a trucking yard, rail yard, or marine harbor for supplying power to a ground, rail, or marine application.

Figure 2:
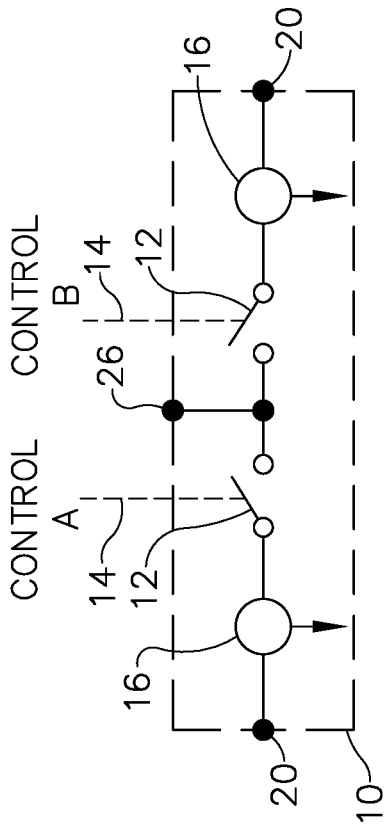
FIG. 2 illustrates a schematic of a first embodiment of a switch module with two single-throw switches, in accordance with various aspects described herein.

Referring now to FIG. 2, in various aspects of the present disclosure, a switch module 10 can comprise two single-throw switches 12 connected in series and each having an input terminal 20 switchable to a common terminal 26 at the series connection. The A and B single-throw switches 12 can each have a control 14 (A or B, respectively) to control the switching of the single-throw switch 12 independent of the other single-switch in the switch module 10. In an aspect illustrated in FIG. 2, each single-throw switch 12 can be a single-pole single-throw (SPST) switch closing or opening a circuit for one conductive pathway. The common terminal 26 and at least one of the input terminals 20 can be configured to connect to one of a source of electrical power or a load.

The switch module 10 can be an aircraft high current switch module configured for a primary system of an aircraft electrical system. For example, the switch module 10 can be designed to suit a high current or environmental specifications unique to the aircraft electrical system. At least one of the single-throw switches 12 can be a solid state switch such as a MOSFET or other device. The solid state switch 12 can be unique to an aircraft specification such as temperature, shock, vibration, current rating, protection against transient signals, operating voltage, or operating current. The single-throw switch 12 can also be an electromechanical switch such as a relay or circuit breaker and can be controlled by control 14.

At least one of the single-throw switches 12 can be bidirectional for passing current in both directions. For example, a bidirectional switch can be a Triac, relay, or other device configured to pass the voltages and currents particular to an aircraft electrical network when controlled by control 14. Alternatively, one or more of the single-throw switches 12 can be unidirectional, such as a silicon controlled rectifier (SCR) having unidirectional properties.

Figure 3:
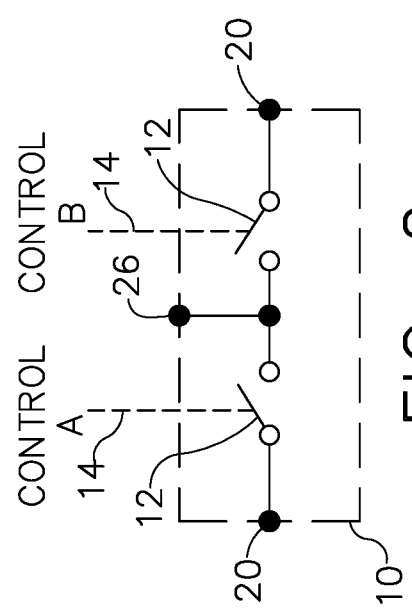
FIG. 3 illustrates the switch module of FIG. 2 including a current measuring device in series with each single-throw switch, in accordance with various aspects described herein.

Referring now to FIG. 3, in various aspects of the disclosure, the switch module 10 can include a current measuring device 16 in series with each of the single-throw switches 12. The current measuring device can include a small series resistor across which a voltage is measured, a Hall Effect sensor, or other components known in the art. The current measuring device 16 can be monitored by a control circuit (not shown) to verify the open/close state of single-throw switch 12 or to detect operating conditions that exceed the specifications of the switch module 10. Alternatively, the switch module 10 can include the current measuring device 16 in series with only one of the single-throw switches 12.

Figure 4:
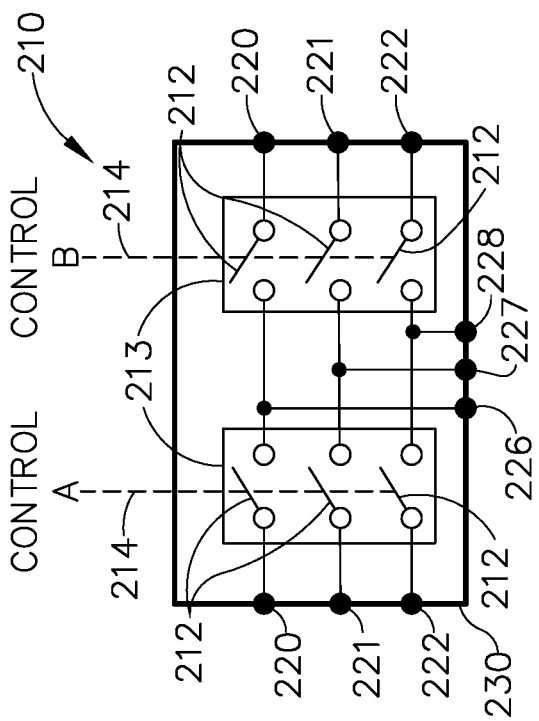
FIG. 4 illustrates a schematic of a second embodiment of a switch module having three single-throw switches, in accordance with various aspects described herein.

Referring now to FIG. 4, in various aspects of the disclosure, the switch module 110 can include three single-throw switches 112 (A, B, and C) each having its own input terminal 120 switchable to a common terminal 126 and having an independent control 114 control (A, B, or C, respectively). As in FIG. 2, each single-throw switch 12 can be a single-pole single-throw (SPST) switch closing or opening a circuit for one conductive pathway.

Figure 5:
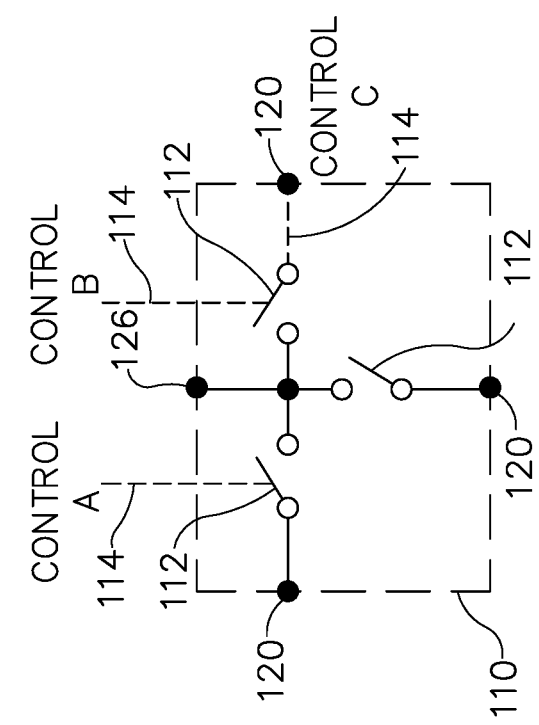
FIG. 5 is a schematic of a third embodiment of a switch module where each single-throw switch has three poles, in accordance with various aspects described herein.

Referring now to FIG. 5, in various aspects of the disclosure, the switch module 210 can comprise two multi-pole single-throw switches 213 (A and B) each comprising three single-pole single-throw switches 212 each having an input terminal (220, 221, or 222) switchable to a common terminal (226, 227, or 228, respectively). The multi-pole single-throw switches 213 can each have an independent control 114 (A or B). For example, switch module 210 can comprise two single-throw switches each capable of selectively switching a three-conductor signal, such as a three-phase AC signal, to the common terminals 226, 227, and 228.

Switch module 210 can further comprise a housing 230 enclosing the single-pole single-throw switches 212. In embodiments not shown, the housing 230 can also be included in the switch module 10 (FIG. 2-3) or 110 (FIG. 4) enclosing the single-throw switches 12 or 112, respectively. At least one of the common terminals (226, 227, 228) or input terminals (220, 221, 222) can be mounted to the housing 230 for relieving a strain imposed on the mounted terminal when connecting or disconnecting a cable or conductor (not shown) from the switch module 210. The switch module 210 can be rack mounted, and the housing 230 can be configured to mount to a rack (not shown).

Alternatively, the switch module 210 can be configured for rack mounting and the housing 230 can be mounted to the switch module 210. At least one of the input (220) or the common 226 terminals can include a connector (not shown) for connecting the one or more terminals (220, 226) of the switch module 210 to a primary electrical system of an aircraft by hand. For example, the input and common terminals of the switch can be a sliding plug or jack having a low contact resistance, similar in principle to the common banana plug, for quick installation and repair of the switch module.

Referring to FIGS. 2-5, the input and common terminals can be connectorized for quick installation and repair without a tool. The switch module (10, 110, 210) can also include a mounting frame (not shown) holding the single-pole switches in alignment for connecting or soldering the input and common terminal to a printed circuit board. The switch module can be applied to any small to medium sized commercial or private aircraft, and to large commercial passenger aircraft. Beneficially, the connection corresponding to common terminals (26, 126, 226) and between the two or more single-throw switches in the switch module are internal and can thereby eliminate an external terminal or connector in electrical network 30. The switch module could also be used in ground or sea applications where high-current electrical power distribution is required, particularly where high current switches are individual modules that are connectorized.

Figure 6:
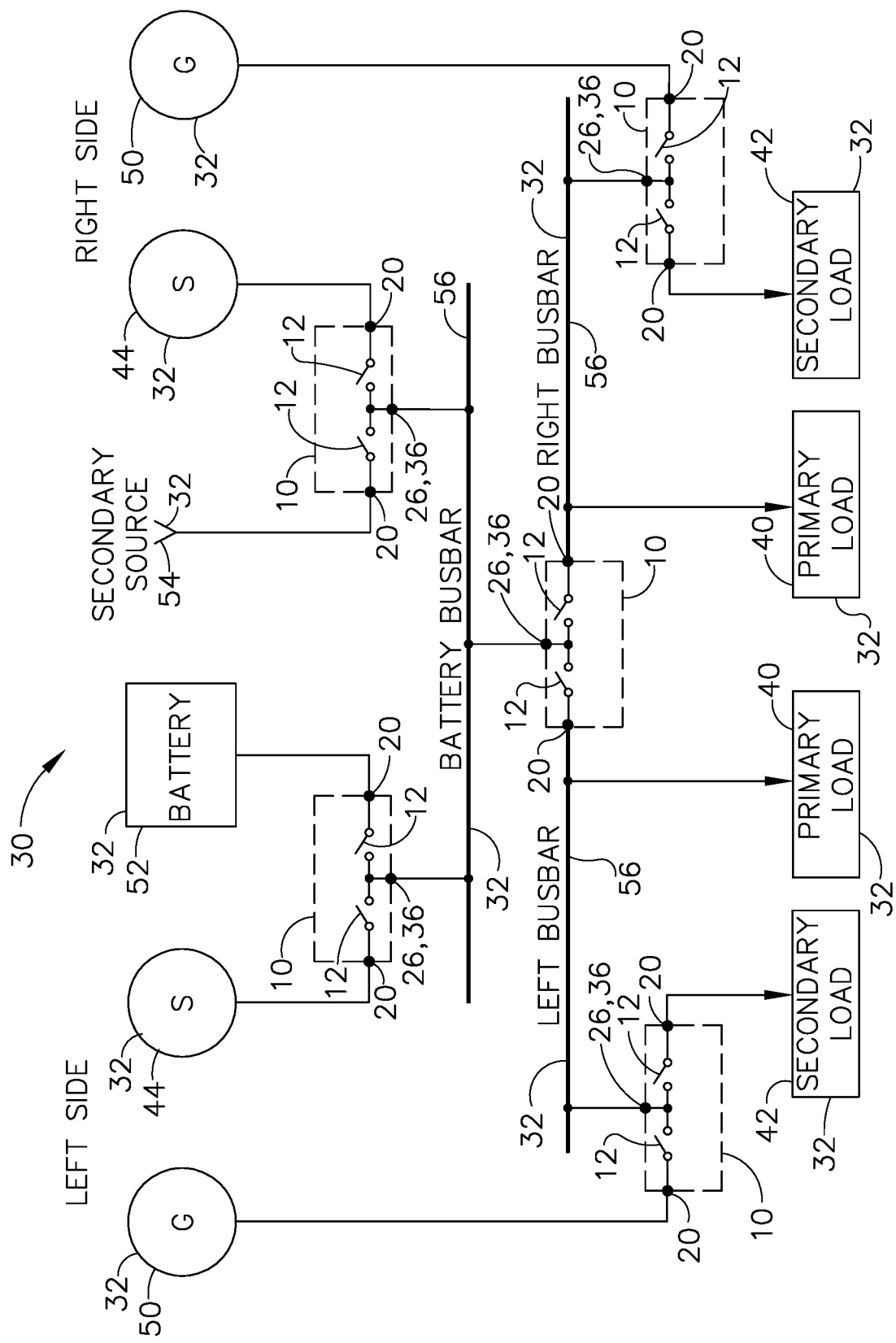
FIG. 6 is a schematic illustrating a method of interconnecting a plurality of elements in the network of FIG. 1 using the switch module of FIG. 2, in accordance with various aspects described herein.

Referring now to FIG. 6, in various aspects of the disclosure, the elements 32 in the network of FIG. 1 can be interconnected using a plurality of switch modules 10 of FIG. 2 to implement the switchable branches 34. Each of the network nodes 36 can be defined as the place where two or more switchable branches 34 electrically meet. A common terminal 26 of each of the switch modules 10 can be located at one of the plurality of network nodes 36. In the illustrated example of FIG. 6, five switch modules 10 having a total of five common terminals 26 are used to implement the switch topology of FIG. 1 by locating common terminals 26 at network nodes 36. Alternate arrangements of switch modules 10 can exist to implement the switch topology of FIG. 1, and one is described below for FIG. 7.

Beneficially, a standardized switch module 10 can be skillfully deployed by assigning the common terminal 26 to network node 36 in electrical network 30 in order to reduce the number of components in the electrical network 30. Additionally, if the switch module 10 includes a housing (230, FIG. 5) enclosing each switch module 10, then a reduction in the volume occupied by the switchable branches can be realized. Also, a total of fifteen input and common terminals of FIG. 6 can represent a 25 percent reduction in the number of switch terminals needing connection within electrical network 30 compared to the twenty terminals required in FIG. 1, and thereby can improve the reliability of electrical network 30.

Continuing with FIG. 6, in various aspects, the battery bus bar 56 can be simplified to tie only three components together (the three upper switch modules 10) since some of the connections to the battery bus bar 56 are now absorbed within the three upper switch modules. This can be a smaller number of connections than the six connections required for the individual single-throw switchable branches 34 of FIG. 1.

In aspects not shown, a switch module can be designed to include three single-throw switches each having an input terminal switchable to a common terminal with the advantage that greater economies of scale and compactness can be achieved over the two-switch module 10 illustrated in FIG. 6. In applying a three-switch embodiment of the switch module to electrical network 30, network nodes can be identified where three or more switchable branches meet electrically, and then the common terminal of the switch module can be located at the network node. However, it may occur that at least one of the single-throw switches in at least one of the three-switch modules will be unused, such as when a network node connects to only two switchable branches. For example, the switchable branches of FIG. 1 can be replaced by four switch modules each containing three single-throw switches (instead of the five switch modules of FIG. 6), and can result in a total of two single-throw switches being unused.

Figure 7:
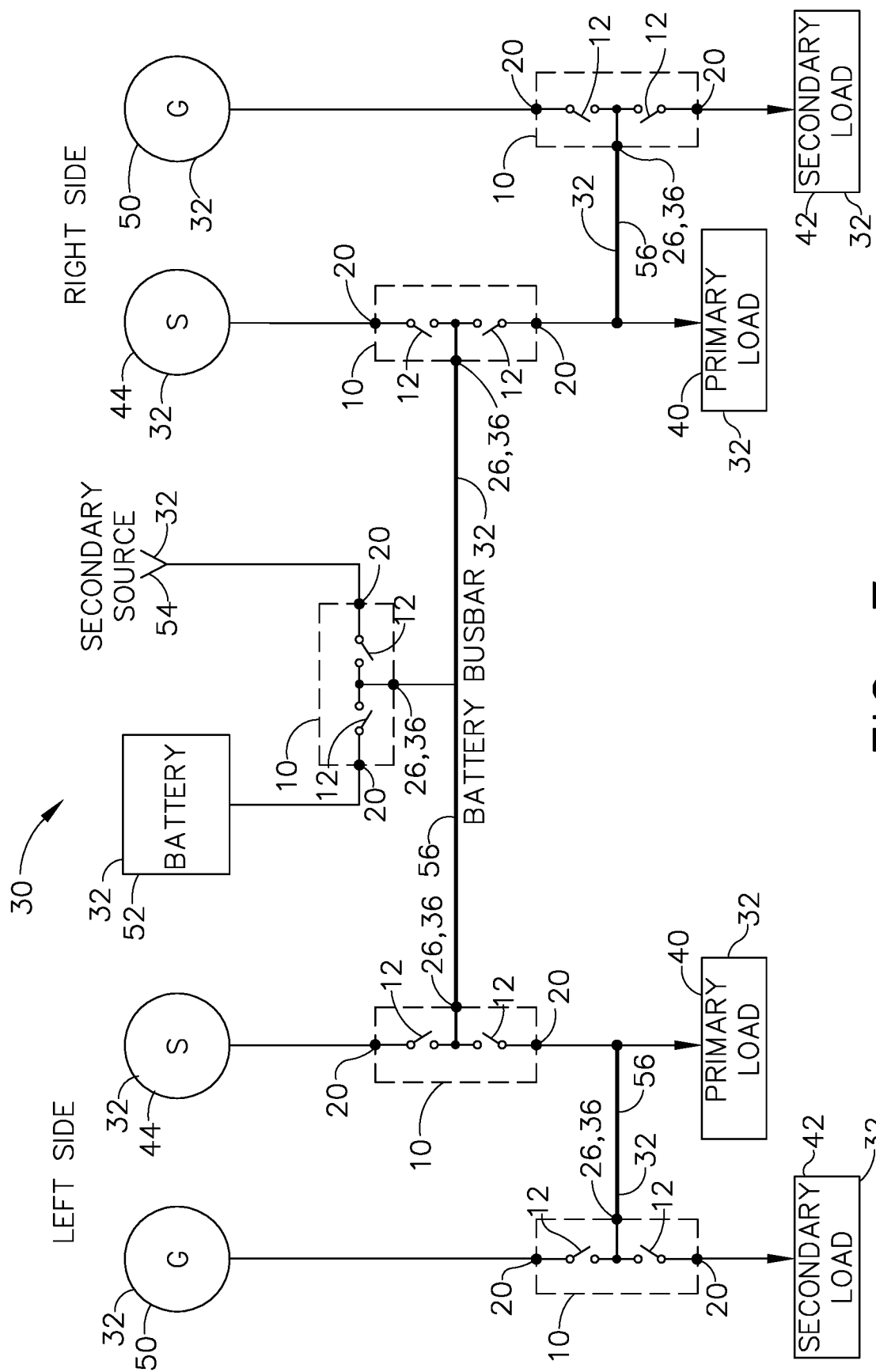
FIG. 7 is a schematic illustrating a method of interconnecting a plurality of elements in the network of FIG. 1 using the switch module of FIG. 2 in another configuration, in accordance with various aspects described herein.

Referring now to FIG. 7, in various aspects of the disclosure, another arrangement of interconnecting the plurality of elements 32 in FIG. 1 is shown using the switch module 10 of FIG. 2. An alternate selection of network nodes 36 can be identified which, when assigned to the common terminals 26 of switch module 10 of FIG. 1, fully instantiate the switch topology of FIG. 1 without leaving unused single-throw switches 12. Note that the number of elements 32 and switch modules 10 connected to each of the left and right bus bars 56 decline from four connections in FIG. 1 to three connections in FIG. 7. This implementation of switch modules 10 in FIG. 7 can absorb five of the 20 terminal connections of FIG. 1 and can lead to a 25 percent of reduction in the terminal connections in electrical network 30.

Additional configurations of switch module 10 are possible, and can beneficially accommodate other constrains in a high current distribution system, such as wiring particulars and the location of various elements 32. For example, referring to FIG. 7, the left side starter 44 and the battery 52 may be located close to each other in the aircraft and form a more convenient node for implementing switch module 10 than the battery 52 and the secondary source 54.

Figure 8:
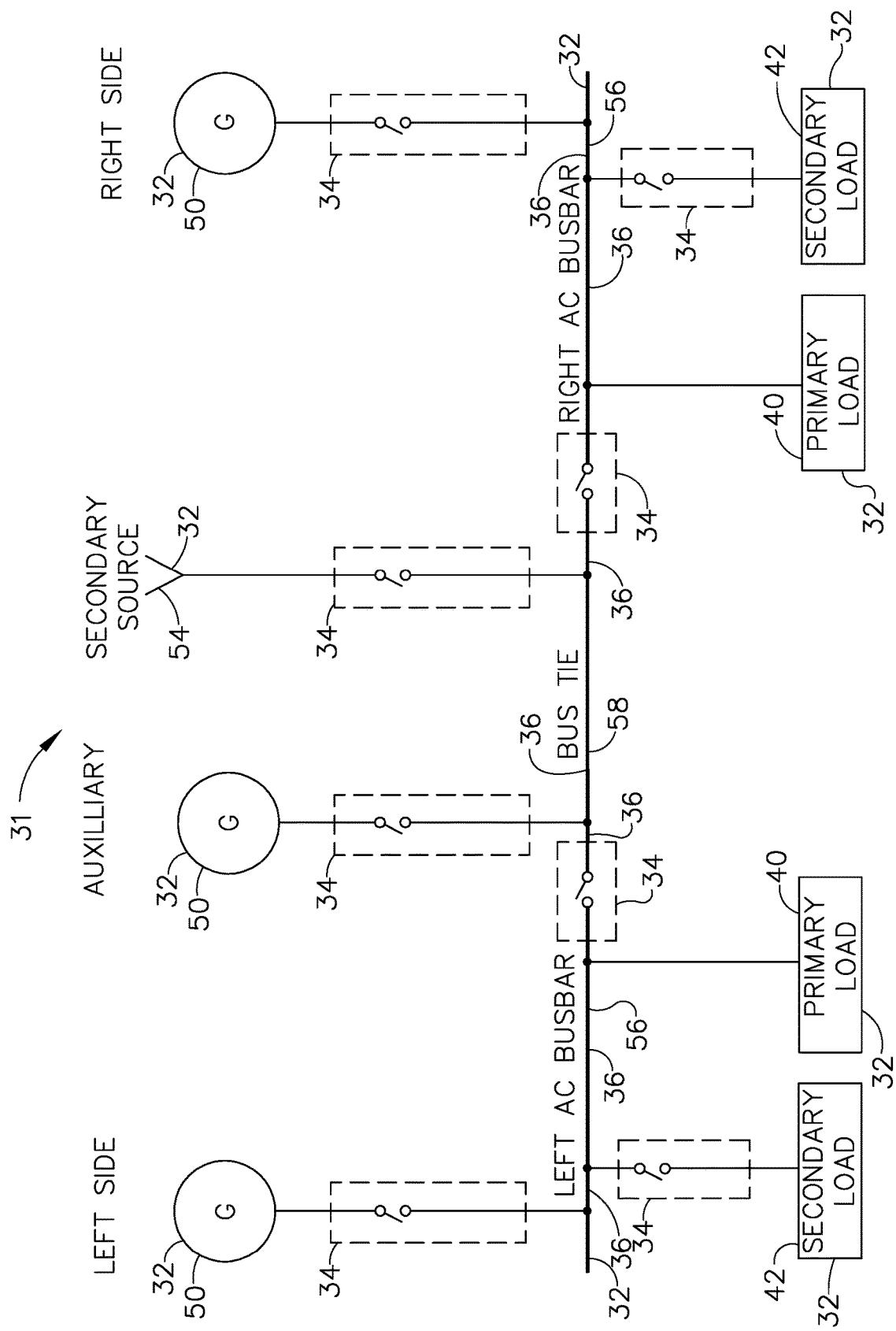
FIG. 8 illustrates a second electrical network of elements connected with switchable branches.

FIG. 8 illustrates a second electrical network 31 which can comprise eight elements 32 and two bus bars 56 connectable by eight switchable branches 34. Sources of electrical power include three generators 50 and the secondary source 54. Electrical loads include two primary loads 40 and two secondary loads 42. Each of the switchable branches 34 can represent an individual multi-pole switch switching an AC signal having two or more conductors. A bus tie 58 can tie two or more bus bars 56 together for the purpose of providing redundancy should the left or right side fail in the electrical network 31.

The bus tie 58 can function as one of the network nodes 36 and can comprise a low resistance conductor for receiving power from at least one source of electrical power in the network 30, such as one of the generators 50, and delivering the received power to at least two other elements 32 in the network, such as the left and right bus bars 56.

Figure 9:
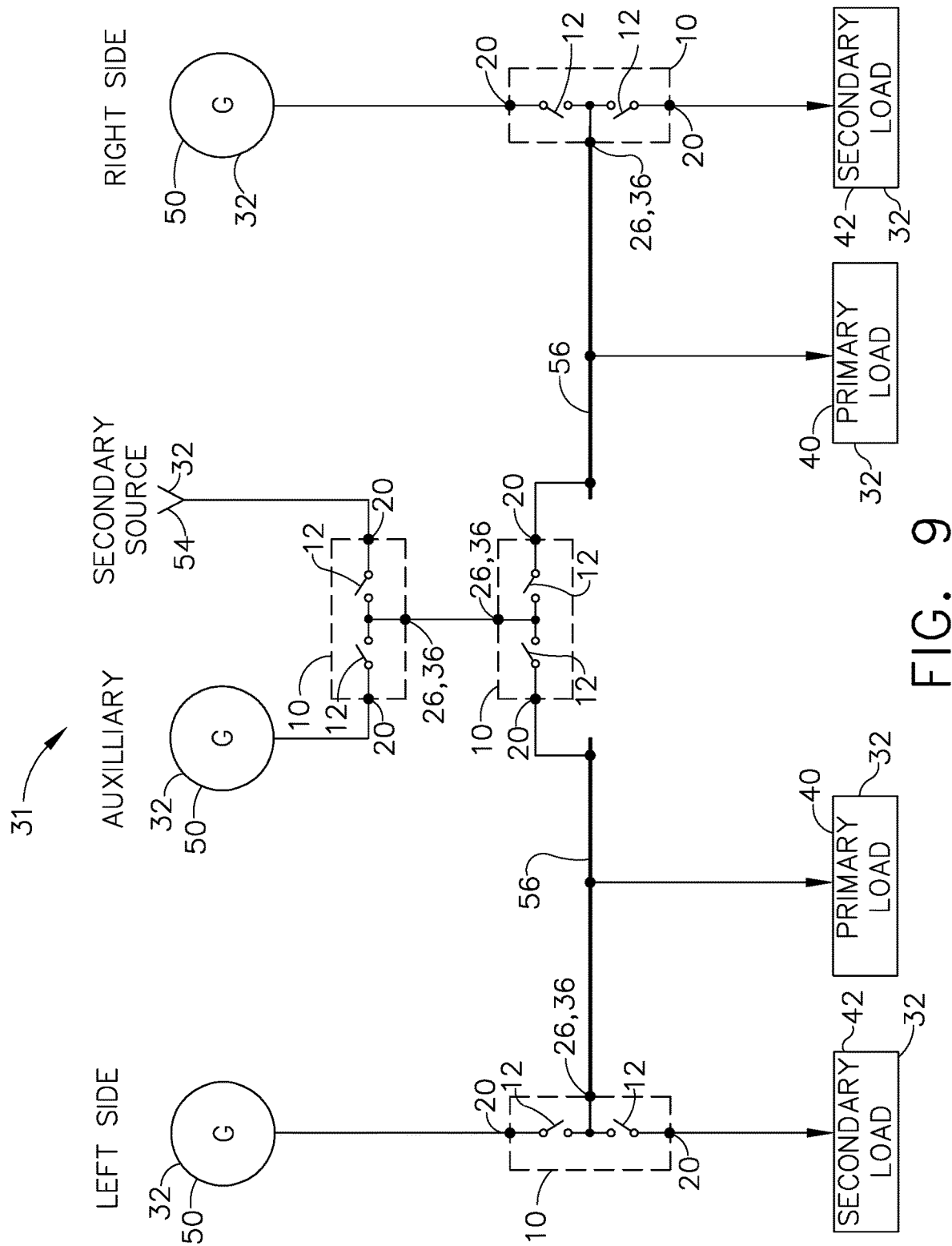
FIG. 9 is a schematic illustrating a method of interconnecting a plurality of elements in the network of FIG. 8 using the switch module of FIG. 2, in accordance with various aspects described herein.

Referring now to FIG. 9, in various aspects of the disclosure, the elements 32 in the network of FIG. 8 can be interconnected using a plurality of switch modules 10 of FIG. 2 to implement the switchable branches 34. The common terminal 26 of each switch module 10 can be located at one of the plurality of network node 36 formed between two switchable branches being instantiated by the switch module 10. In the illustrated example of FIG. 9, four switch modules having a total of four common terminals 26 can be used to implement the switch topology of FIG. 8. Alternate arrangements (not shown) of switch modules 10 can be employed to implement the switch topology of FIG. 8, and may or may not result in one or more unused single-throw switches 20.

Bus tie 58 can be absorbed by the switch module 10 in the center of FIG. 9. The total number of input terminals 20 and common terminals 26 can be reduced from the sixteen terminals of FIG. 8 to the twelve terminals of FIG. 9. In an alternate configuration not shown, switch modules having three or more single-throw switches can be configured to implement the switch topology of FIG. 8.

Many other possible embodiments and configurations in addition to that shown in the above figures are contemplated by the present disclosure. To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" or "a plurality of" various elements have been described, it will be understood that "a set" or "a plurality" can include any number of the respective elements, including only one element. Combinations or permutations of features described herein are covered by this disclosure.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A switch module for connection to a power distribution system, comprising:
   a housing enclosing a first and a second single-pole bidirectional switch coupled in series;
   the first bidirectional single-throw switch having a first input terminal;
   the second bidirectional single-throw switch having a second input terminal;
   a common terminal wherein the first and second input terminals are switchable to the common terminal;
   a first control coupled to the first bidirectional single-throw switch; and
   a second control coupled to the second bidirectional single-throw switch; and
   wherein the first and second controls are configured to independently control, respectively, the first and second bidirectional single-throw switches;
   wherein the first and second bidirectional switches are connected with one of a power source and an electrical load.

2. The switch module of claim 1 wherein at least one of the first input, the second input, or the common terminals includes a connector for connecting to a primary electrical system of an aircraft.

3. The switch module of claim 1 wherein the housing is configured for rack mounting.

4. The switch module of claim 3 further comprising mounting at least one of the first input, the second input, or the common terminals to the housing for strain relief.

5. The switch module of claim 1 further comprising a third single-throw switch having a third input terminal switchable to the common terminal and a third control configured to independently control the third single-throw switch.

6. The switch module of claim 1 wherein each of the first and second bidirectional single-throw switches is a bidirectional single-pole single-throw (SPST) switch.

7. The switch module of claim 1 wherein each bidirectional single-throw switch is a multi-pole single-throw switch and wherein the first and second controls are configured to control the poles.

8. The switch module of claim 1 further comprising a current measuring device in series with each of the first and the second bidirectional single-throw switches.

9. The switch module of claim 1 wherein at least one of the first and second bidirectional single-throw switches is solid state.

10. A method of interconnecting a plurality of elements in a network having at least two switchable branches, the method comprising:
    identifying a network node where a first switchable branch connecting a power source meets a second switchable branch connecting a second element;
    configuring a switch module comprising a housing enclosing a first single-throw switch having a first input terminal and a second single-throw switch having a second input terminal, the first and the second single-throw switches being connected in series at a common terminal connected with a power bus; and
    locating the common terminal of the switch module at the network node, connecting the first input terminal to the power source, and connecting the second input terminal to the second element; and
    independently controlling each of the single-throw switches.

11. The method of claim 10 wherein second element is one of a source of electrical power or a load.

12. The method of claim 10 wherein the power bus is configured to deliver electrical power to at least two other elements in the network.

13. The method of claim 10 further comprising a plurality of switch modules, the common terminal of each of the plurality of switch modules being assigned to one of a plurality of network nodes.

14. The method of claim 10 further compromising identifying a third switchable branch connecting a third element and meeting the network node, wherein the switch module contains a third single-throw switch having a third input terminal connected to the third element.

15. The method of claim 10 further compromising measuring current between the first input terminal and the power source, and between the second input terminal and the second element.

16. An aircraft comprising:
    a network having at least two switchable branches;
    a network node where a first switchable branch connecting at least one of a first power source and a first electrical load meets a second switchable branch connecting at least one of a second power source and a second electrical load;
    a switch module comprising a housing enclosing a first single-throw switch having a first input terminal connected to at least one of a first power source and a first electrical load and a second single-throw switch having a second input terminal connected to at least one of a second power source and a second electrical load, the first and the second single-throw switches being connected in series at a common terminal connected with a power bus;
    a first control coupled to the first single-throw switch;
    a second control coupled to the second single-throw switch; and
    wherein the first and second controls are configured to independently control, respectively, the first and second single-throw switches.

17. The aircraft of claim 16 wherein at least one of the first and second single-throw switches is bidirectional.

18. The aircraft of claim 16 further comprising a current measuring device in series with each of the first and the second single-throw switches.

19. The aircraft of claim 16 wherein at least one of the first and second single-throw switches is solid state.

* * * * *